(12) United States Patent
Li et al.

(10) Patent No.: US 11,075,120 B2
(45) Date of Patent: Jul. 27, 2021

(54) FINFET DEVICE AND METHOD

(71) Applicant: Taiwan Semiconductor Manufacturing Company, Ltd., Hsinchu (TW)

(72) Inventors: Kun-Mu Li, Zhudong Township (TW); Heng-Wen Ting, Pingtung (TW); Hsueh-Chang Sung, Zhubei (TW); Yen-Ru Lee, Hsinchu (TW); Chien-Wei Lee, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/542,578

(22) Filed: Aug. 16, 2019

(65) Prior Publication Data

US 2021/0050267 A1 Feb. 18, 2021

(51) Int. Cl.
| | | |
|---|---|---|
| *H01L 21/82* | (2006.01) | |
| *H01L 21/8234* | (2006.01) | |
| *H01L 21/308* | (2006.01) | |
| *H01L 27/088* | (2006.01) | |
| *H01L 29/78* | (2006.01) | |
| *H01L 21/3065* | (2006.01) | |

(52) U.S. Cl.
CPC .. *H01L 21/823431* (2013.01); *H01L 21/3065* (2013.01); *H01L 21/3083* (2013.01); *H01L 21/823418* (2013.01); *H01L 21/823481* (2013.01); *H01L 27/0886* (2013.01); *H01L 29/785* (2013.01)

(58) Field of Classification Search
CPC ..... H01L 21/823431; H01L 21/823481; H01L 29/785
See application file for complete search history.

(56) References Cited

U.S. PATENT DOCUMENTS

| | | | | |
|---|---|---|---|---|
| 8,110,458 | B2* | 2/2012 | Jin | B82Y 10/00 |
| | | | | 438/197 |
| 8,828,813 | B2* | 9/2014 | Huang | H01L 29/66651 |
| | | | | 438/183 |
| 8,963,258 | B2* | 2/2015 | Yu | H01L 29/0657 |
| | | | | 257/401 |
| 9,530,868 | B2* | 12/2016 | Huang | H01L 21/3086 |
| 9,780,216 | B2* | 10/2017 | Huang | H01L 29/785 |
| 9,812,363 | B1* | 11/2017 | Liao | H01L 29/0649 |
| 10,079,305 | B2* | 9/2018 | Lee | H01L 29/66545 |
| 10,504,993 | B2* | 12/2019 | Lee | H01L 27/0886 |
| 10,566,244 | B2* | 2/2020 | Lee | H01L 27/0924 |
| 10,734,379 | B2* | 8/2020 | Ho | H01L 29/66795 |

\* cited by examiner

*Primary Examiner* — William Coleman
(74) *Attorney, Agent, or Firm* — Slater Matsil, LLP

(57) ABSTRACT

A device includes a fin over a substrate, the fin including a first end and a second end, wherein the first end of the fin has a convex profile, an isolation region adjacent the fin, a gate structure along sidewalls of the fin and over the top surface of the fin, a gate spacer laterally adjacent the gate structure, and an epitaxial region adjacent the first end of the fin.

20 Claims, 25 Drawing Sheets

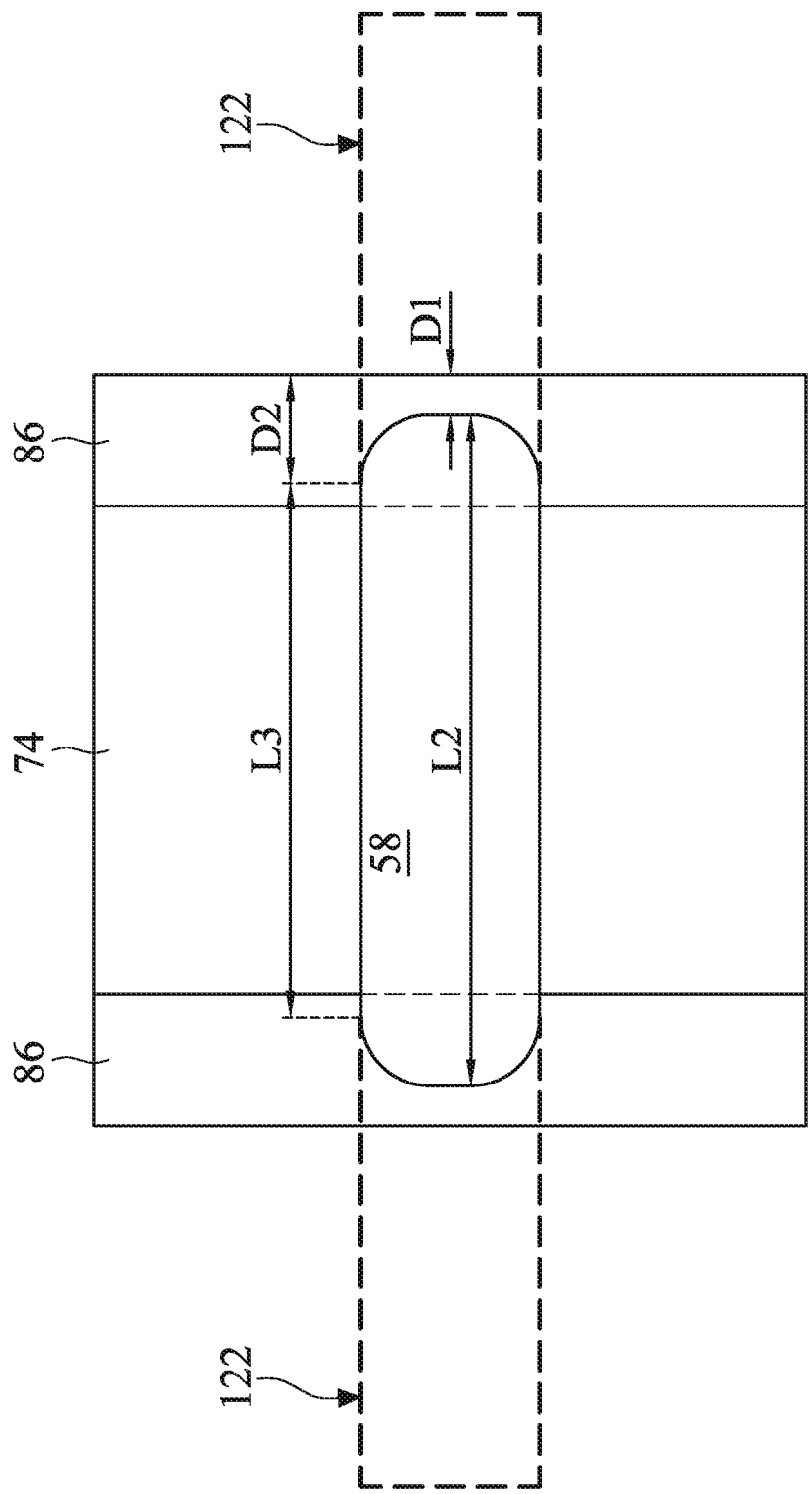

FINFET DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 9C, 10A, 10B, 10C, 11A, 11B, 11C, 11D, 12A, 12B, 12C, 12D, 12E, 13A, 13B, 14A, 14B, 15A, 15B, 16A, 16B, 16C, 17A, 17B, 18A, and 18B are cross-sectional views or plan views of intermediate stages in the manufacturing of FinFETs, in accordance with some embodiments.

DETAILED DESCRIPTION

Figure 1:
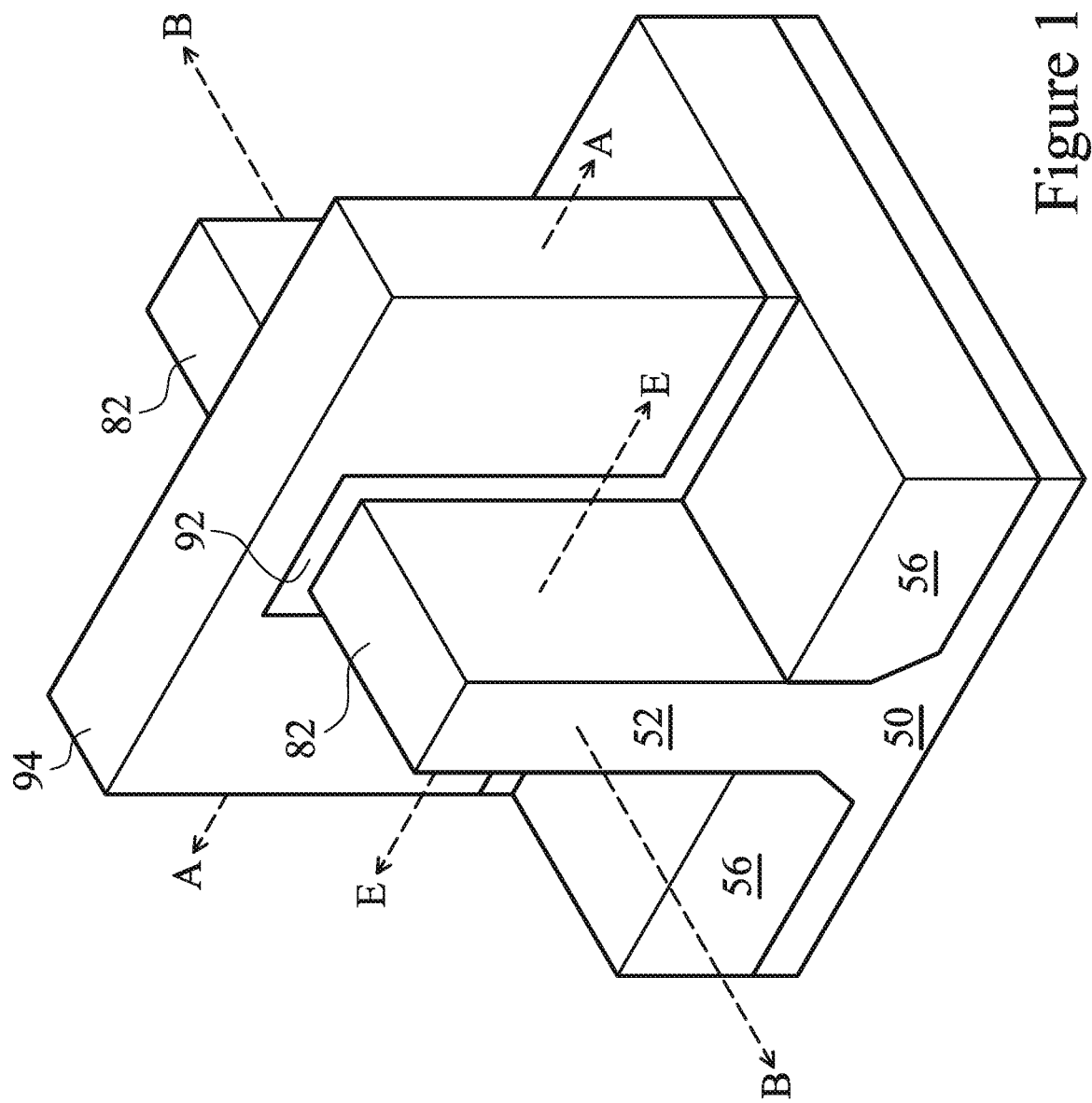
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are discussed herein in a particular context, namely, reshaping semiconductor fins prior to forming epitaxial source/drain regions in a FinFET transistor. However, various embodiments may be applied to other semiconductor devices/processes, such as planar transistors. In some embodiments, recesses for the epitaxial source/drain regions are formed in a fin such that each fin has a round or tapered end at the recesses. In some embodiments, a first etching process is performed to form recesses in the fin, and then a second etching process is performed to reshape the recesses (and thus reshape the fins). In the reshaping etch, the sides of the fin are etched more than the center of the fin to form the rounded end profile. In this manner, the overall channel lengths of the fins can be reduced. By forming fins having a rounded profile at the epitaxial source/drain regions, the channel resistance of the fins can be reduced without significantly increasing short-channel effects.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section E-E is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 18B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 16A, 17A, and 18A are illustrated along reference cross-section A-A illustrated in FIG. 1, and FIGS. 8B, 9B, 10B, 11B, 12B, 13B, 14B, 14C, 15B, 16B, 17B, and 18B are illustrated along a similar cross-section B-B illustrated in FIG. 1, except for multiple fins/FinFETs. FIGS. 9C, 10C, 11C, 11D, and 12C are illustrated in a plan view. FIGS. 12D and 12E are illustrated along reference cross-section E-E illustrated in FIG. 1, except for multiple fins/FinFETs.

Figure 2:
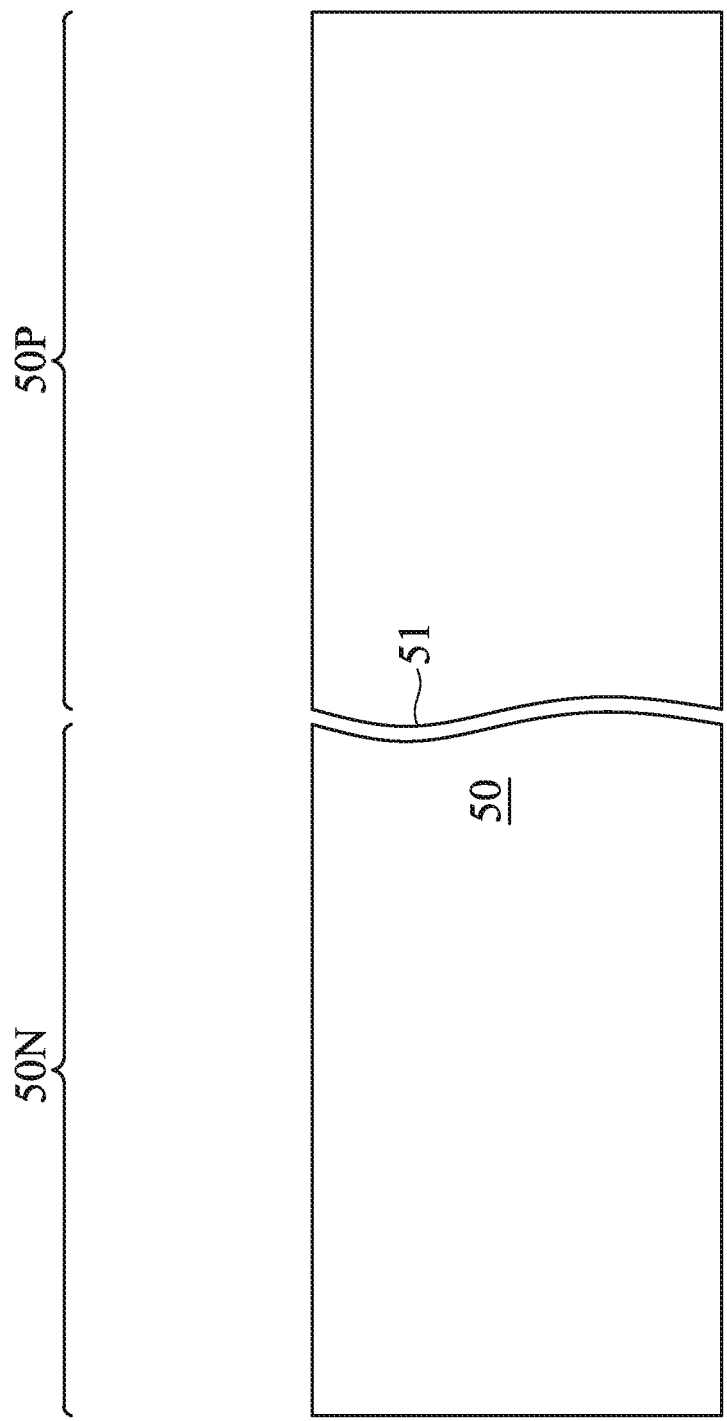

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
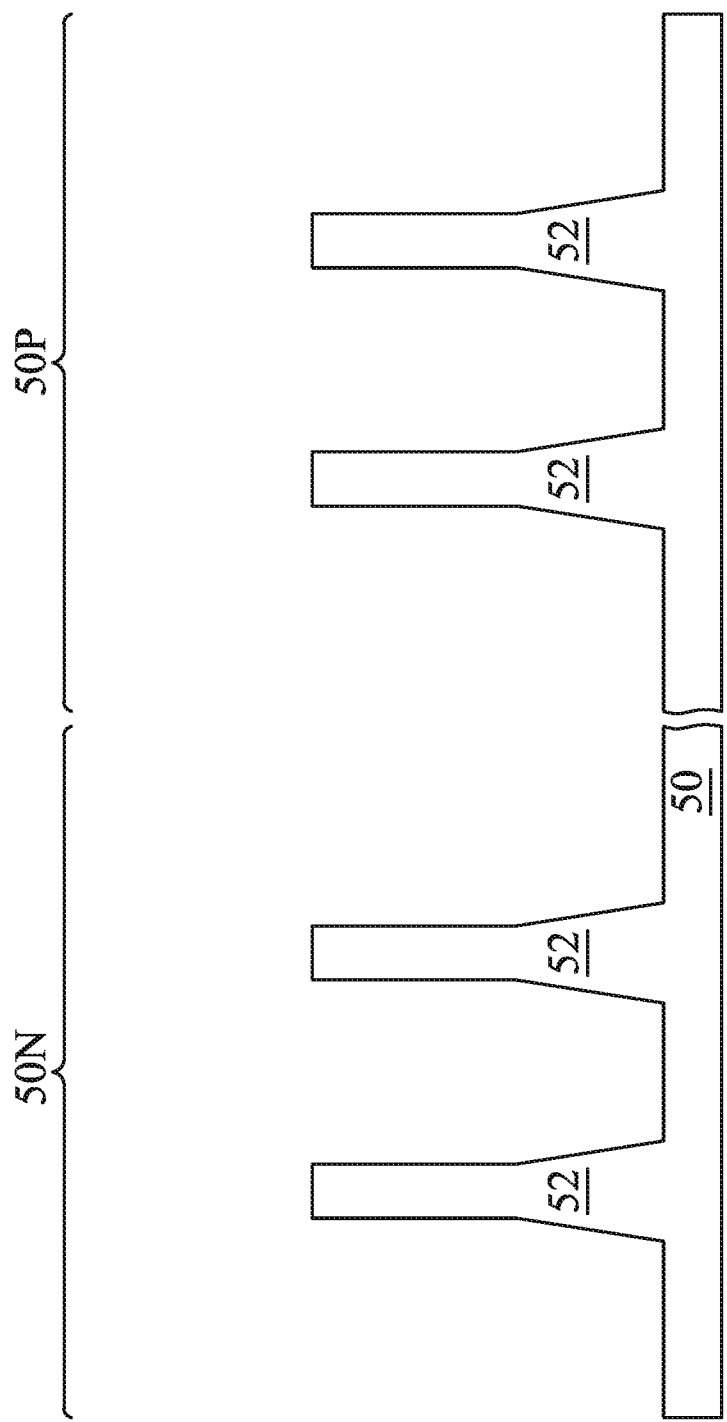

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

Fins 52 may be patterned by any suitable method. For example, fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on fins 52. In some embodiments, fins 52 may be formed having a width that is between about 3 nm and about 15 nm, though fins 52 may be formed having other widths.

Figure 4:
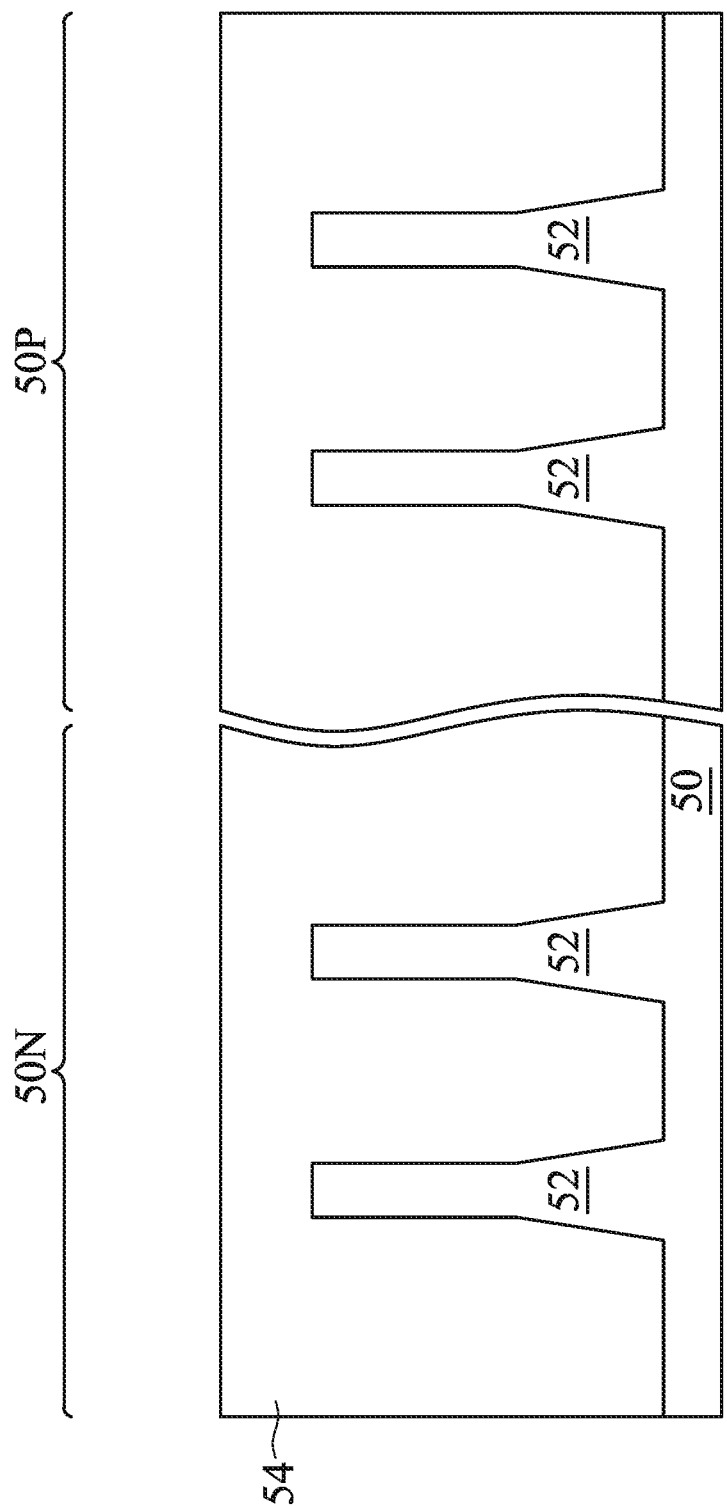

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
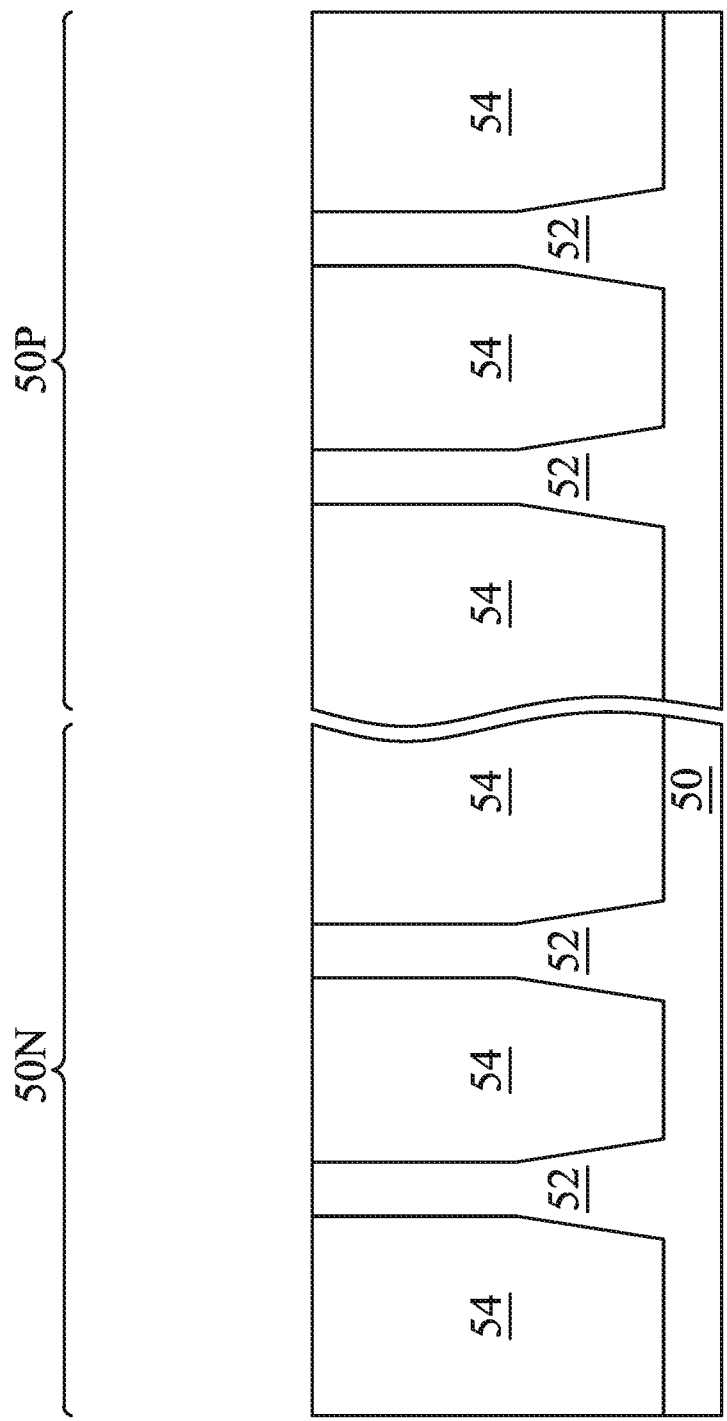

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
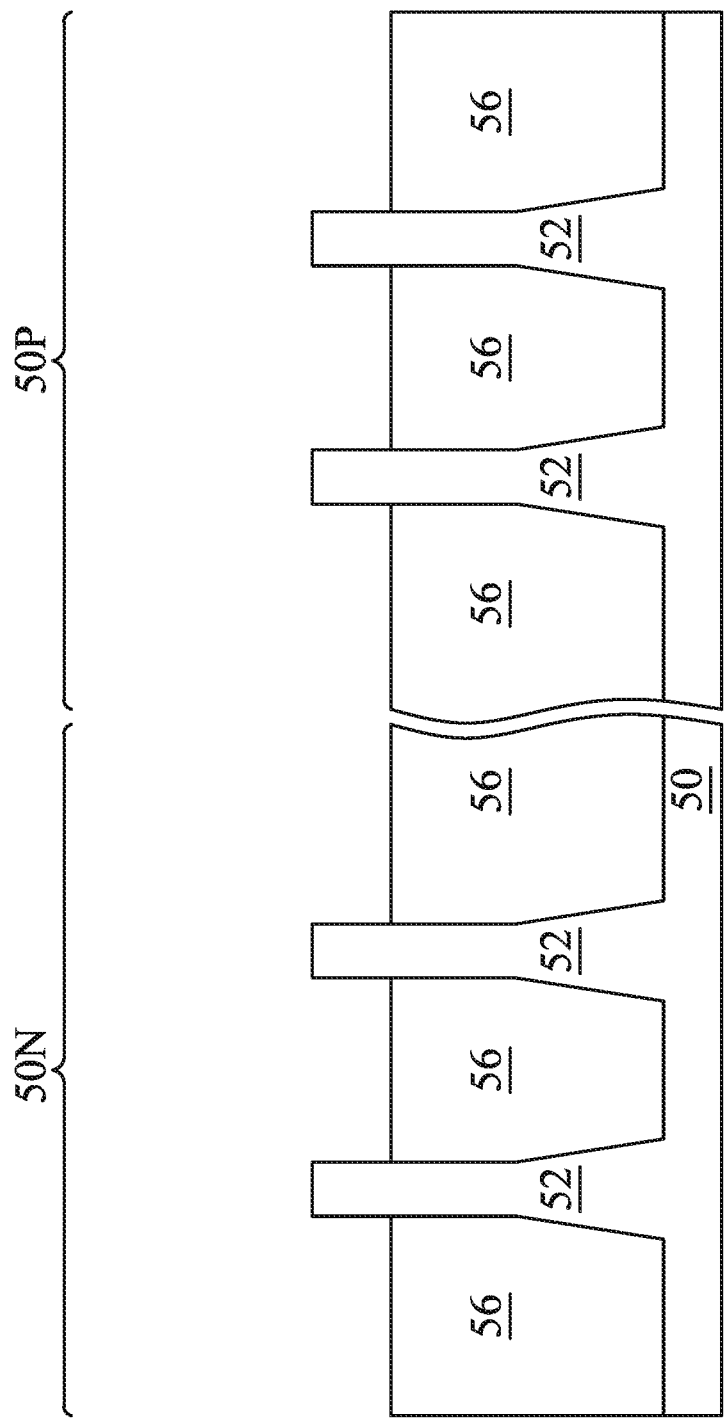

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
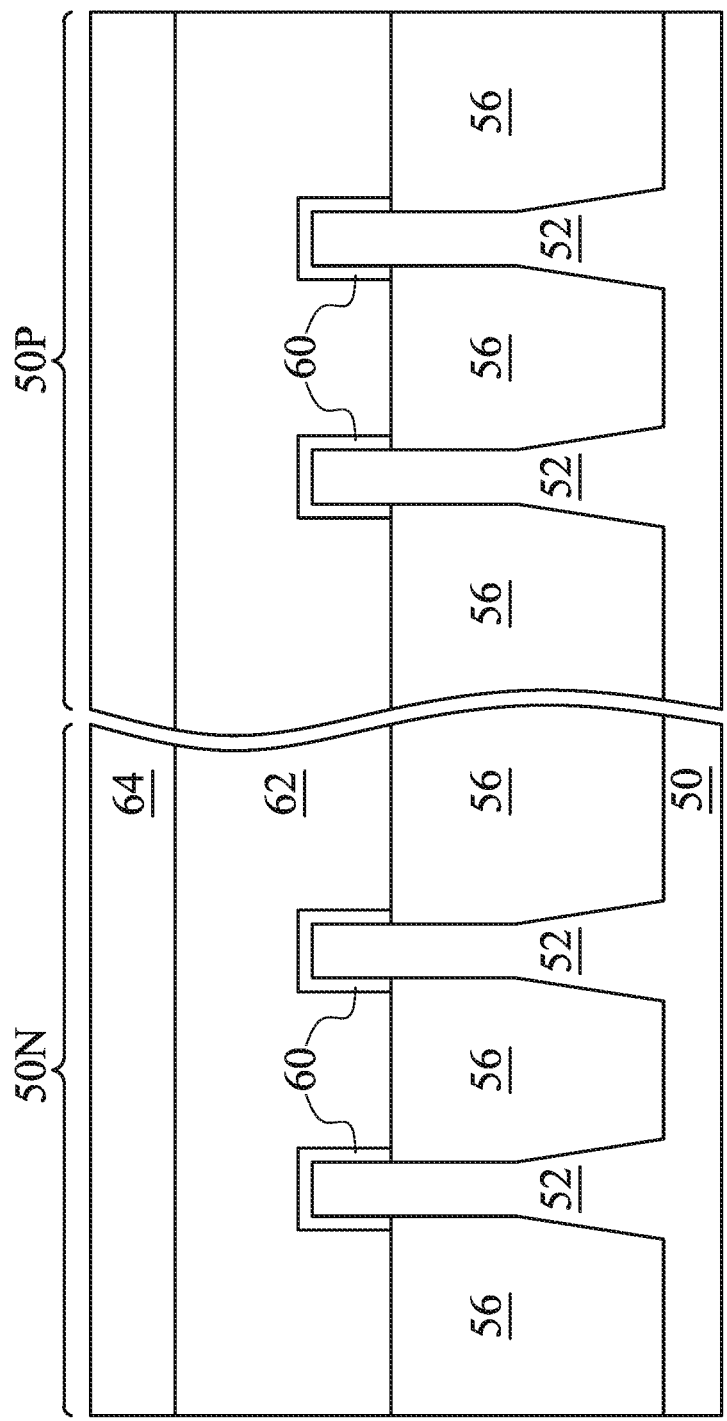

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 18B illustrate various additional steps in the manufacturing of embodiment devices. FIGS. 8A through 18B illustrate features in either of the region 50N or the region 50P. For example, the structures illustrated in FIGS. 8A through 18B may be applicable to both the region 50N and the region 50P. Differences (if any) in the structures of the region 50N and the region 50P are described in the text accompanying each figure.

Figure 8B:
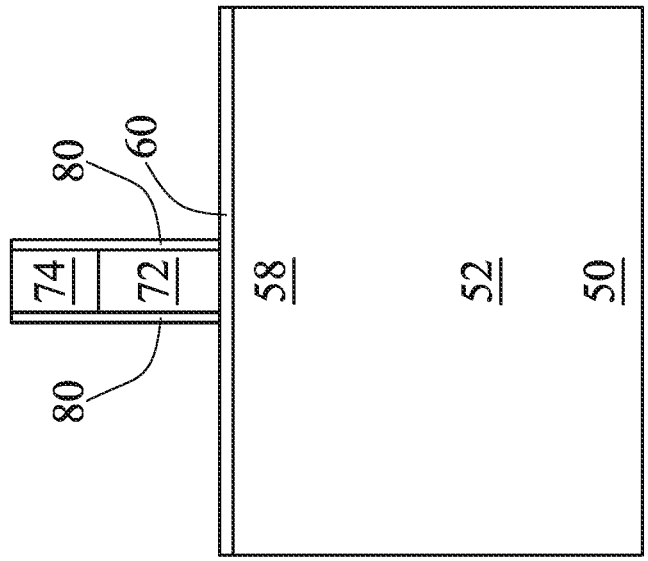
Figure 8A:
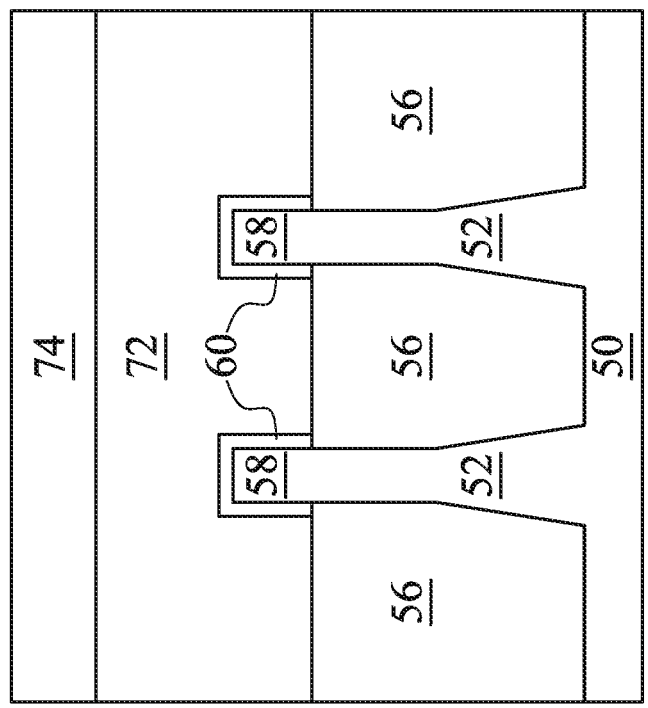

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates 72. The dummy gates 72 may also have a lengthwise direction substantially perpendicular to the lengthwise direction of respective epitaxial fins 52. A mask 74 on a dummy gate 72 may also be referred to as a "dummy gate structure" or a "dummy gate stack."

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
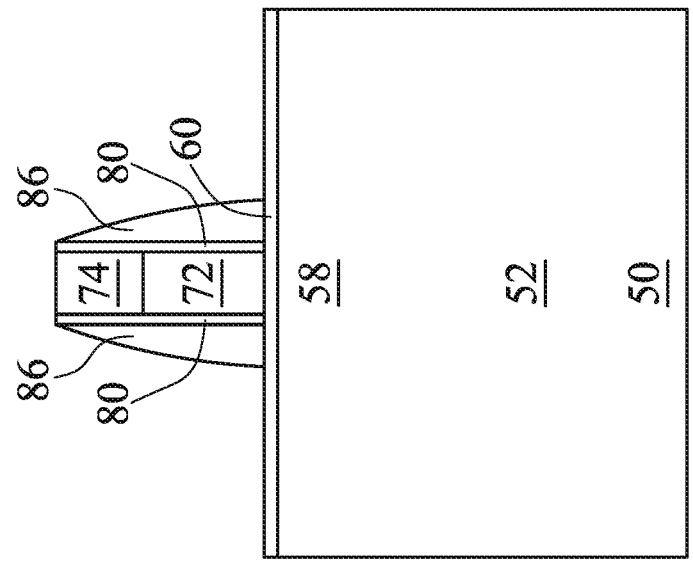
Figure 9A:
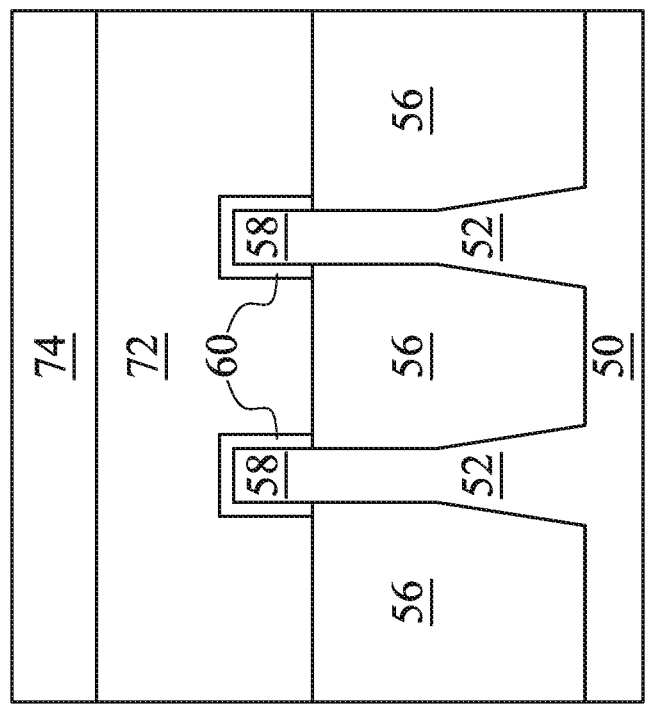
Figure 9C:
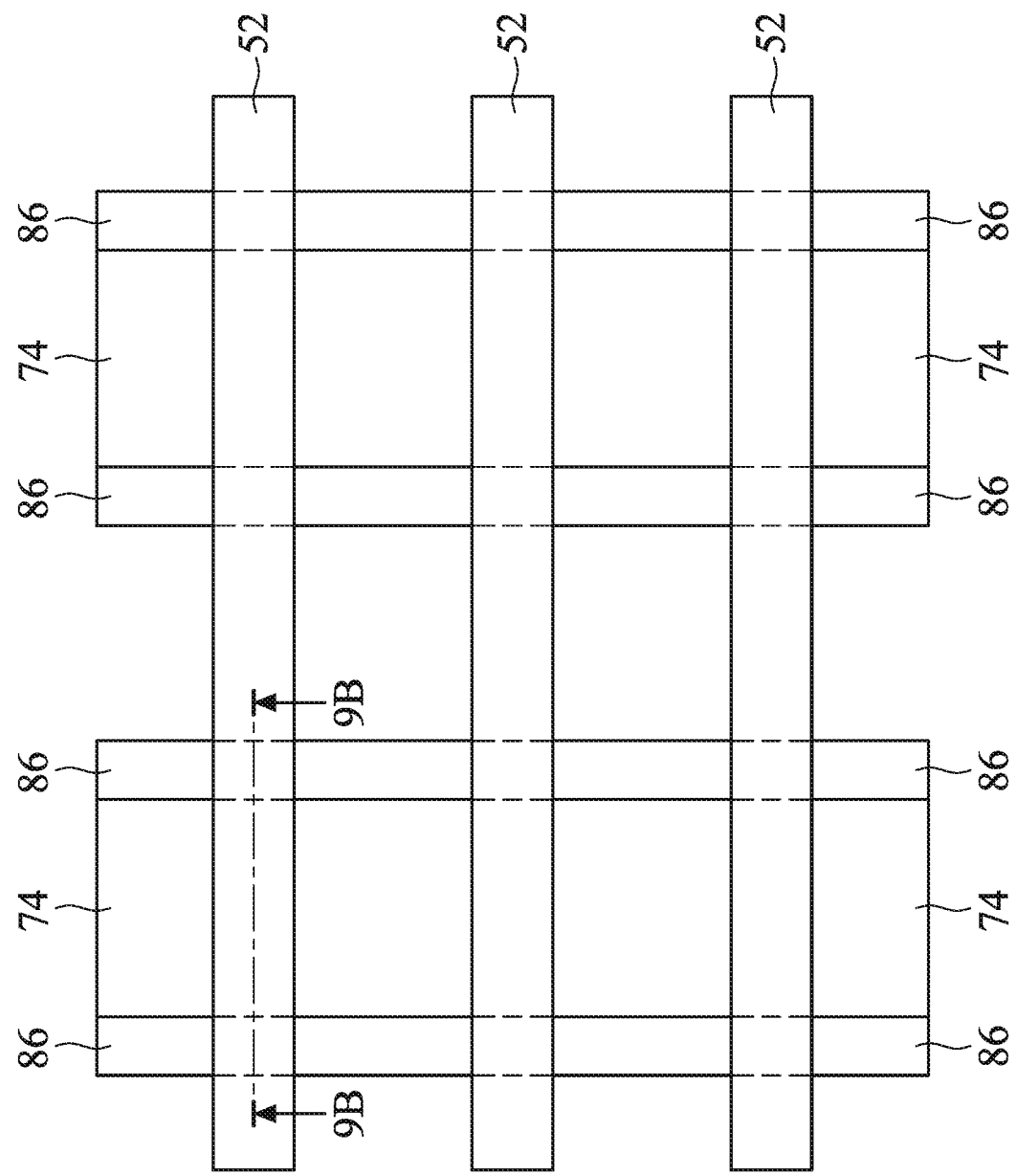

In FIGS. 9A, 9B, and 9C, gate spacers 86 are formed on the gate seal spacers 80 along sidewalls of the dummy gates 72 and the masks 74. FIG. 9C illustrates a plan view of multiple fins 52 and multiple dummy gate structures (masks 74 are shown). An example cross-sectional view as shown in FIG. 9B is labeled in FIG. 9C. For clarity, some features are not explicitly shown in FIG. 9C. In some embodiments, the gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. In some embodiments, gate spacers 86 may include multiple layers. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
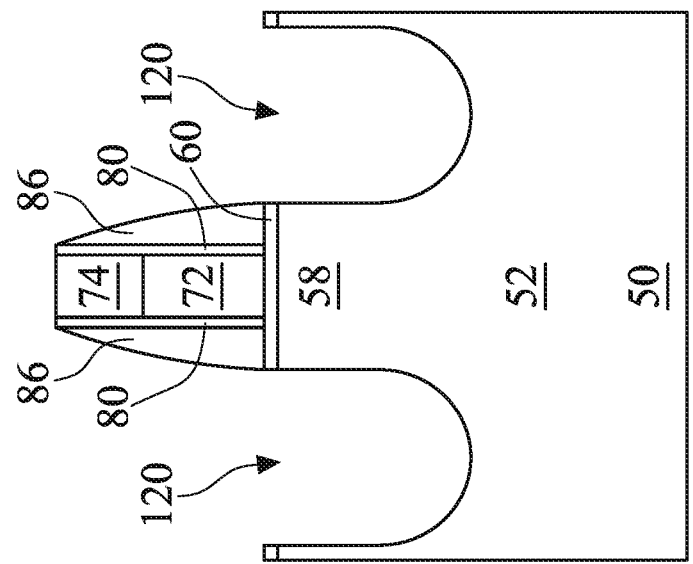
Figure 10A:
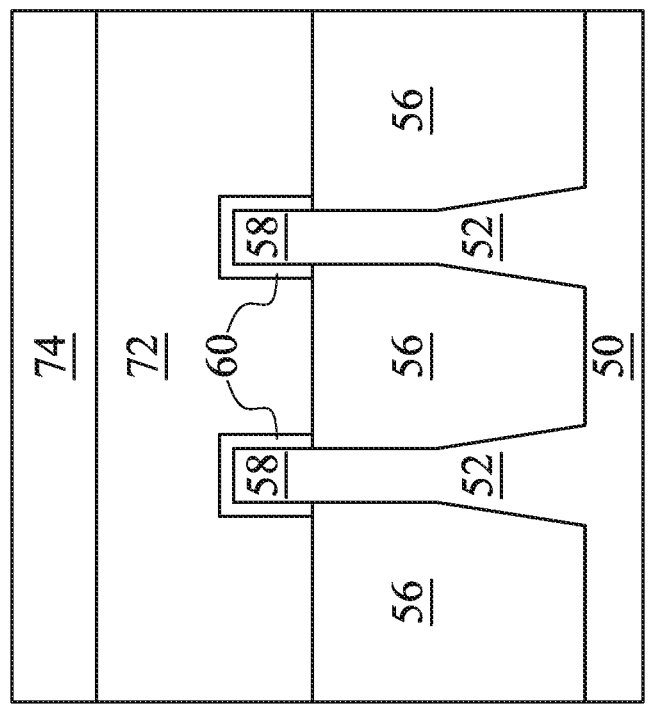
Figure 11B:
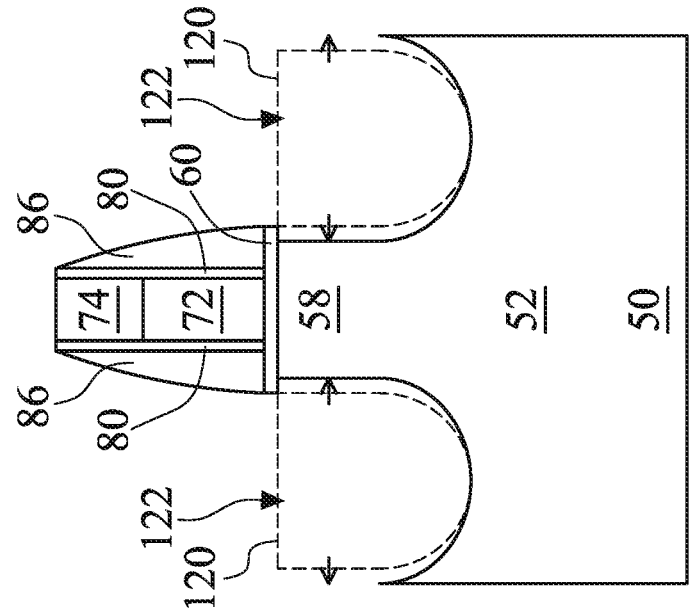
Figure 11A:
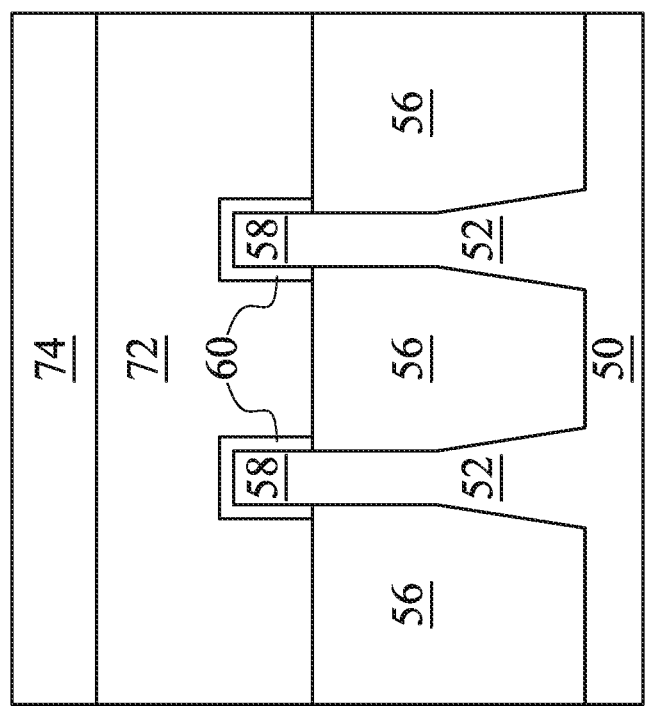
Figure 11C:
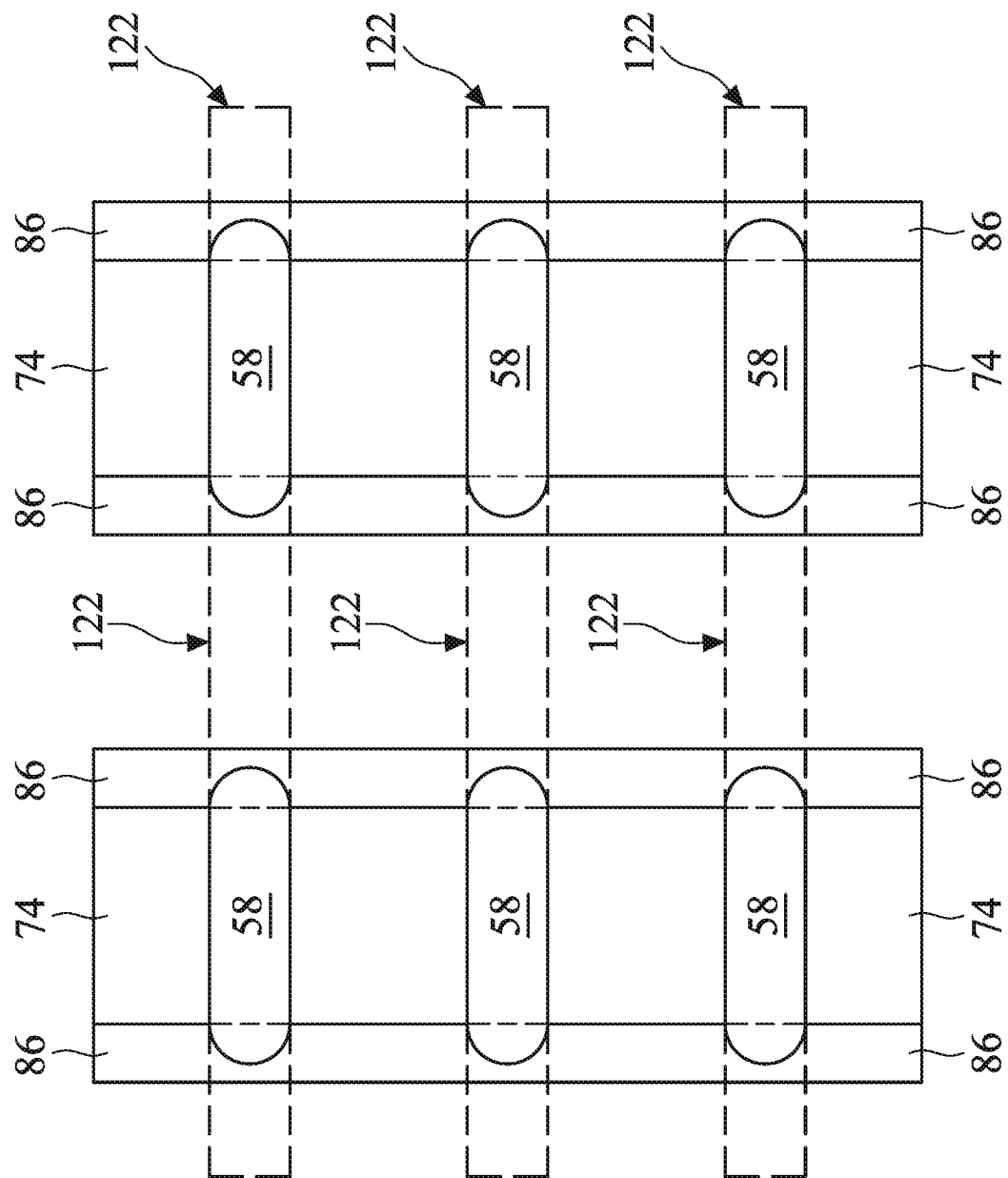
Figure 12B:
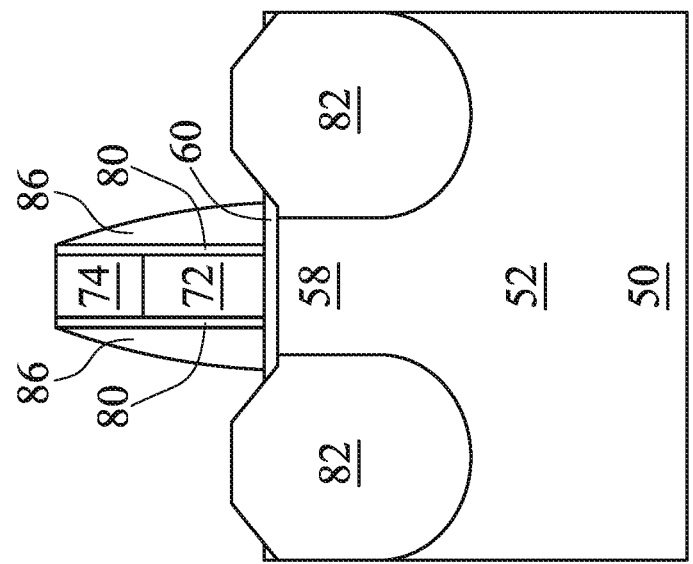
Figure 12A:
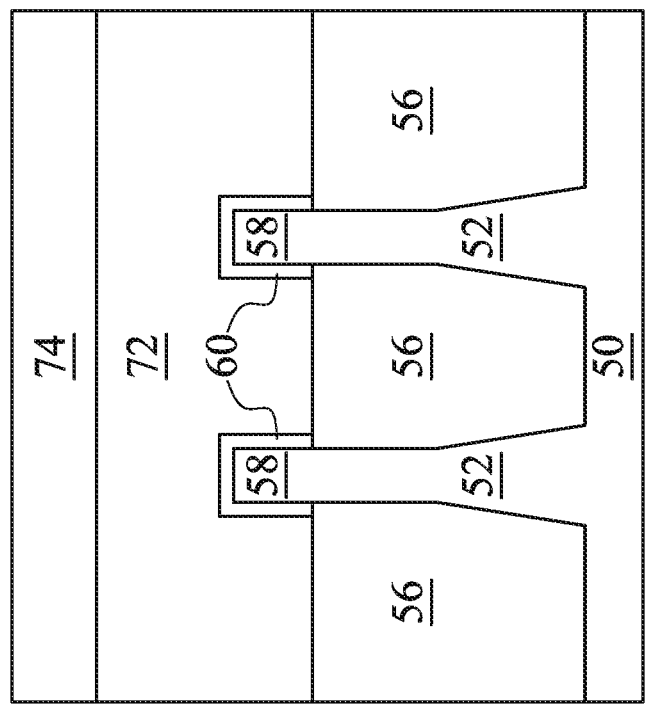
Figure 12C:
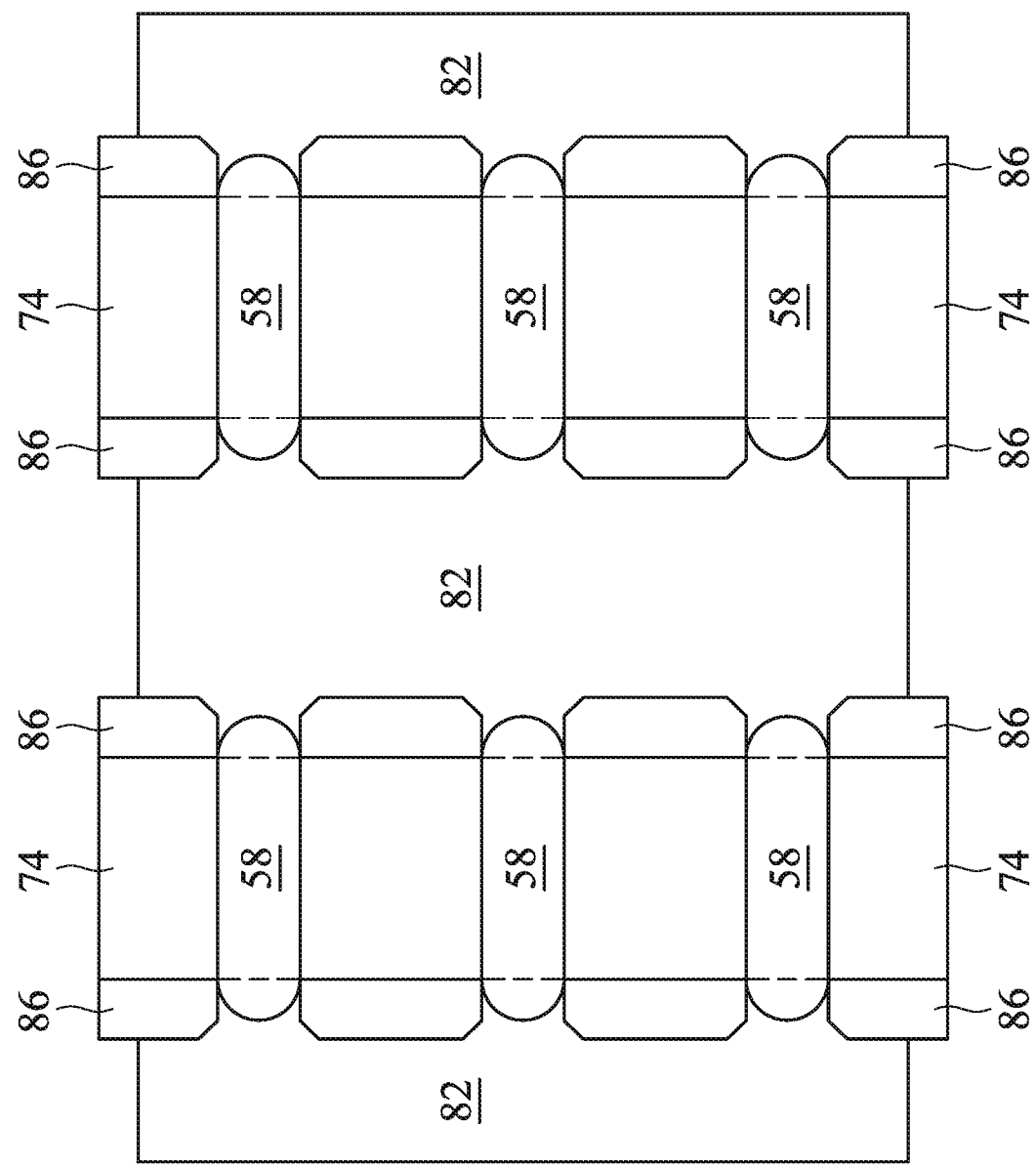
Figure 12D:
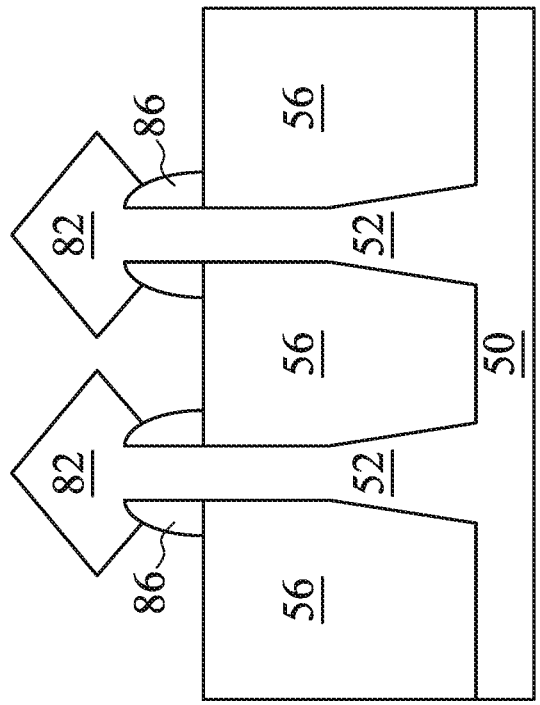
Figure 12E:
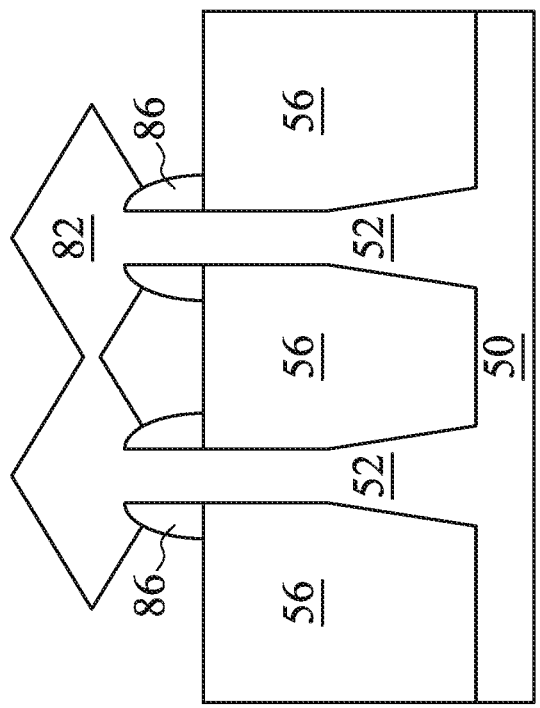

In FIG. 10A-C through FIGS. 12A-E, epitaxial source/drain regions 82 are formed in the fins 52, according to some embodiments. FIGS. 10A, 11A, and 12A are illustrated along reference cross-section A-A. FIGS. 10B, 11B, and 12B are illustrated along reference cross-section B-B. FIGS. 10C, 11C, 11D, and 12C are illustrated in a plan view. FIGS. 12D and 12E are illustrated along reference cross-section E-E. The epitaxial source/drain regions 82 (see FIGS. 12A-E) are formed in the fins 52 such that each dummy gate 72 is disposed between respective neighboring pairs of the epitaxial source/drain regions 82. In some embodiments, the epitaxial source/drain regions 82 may extend through the LDD regions. In some embodiments, the gate seal spacers 80 and gate spacers 86 are used to separate the epitaxial source/drain regions 82 from the dummy gates 72.

Figure 10C:
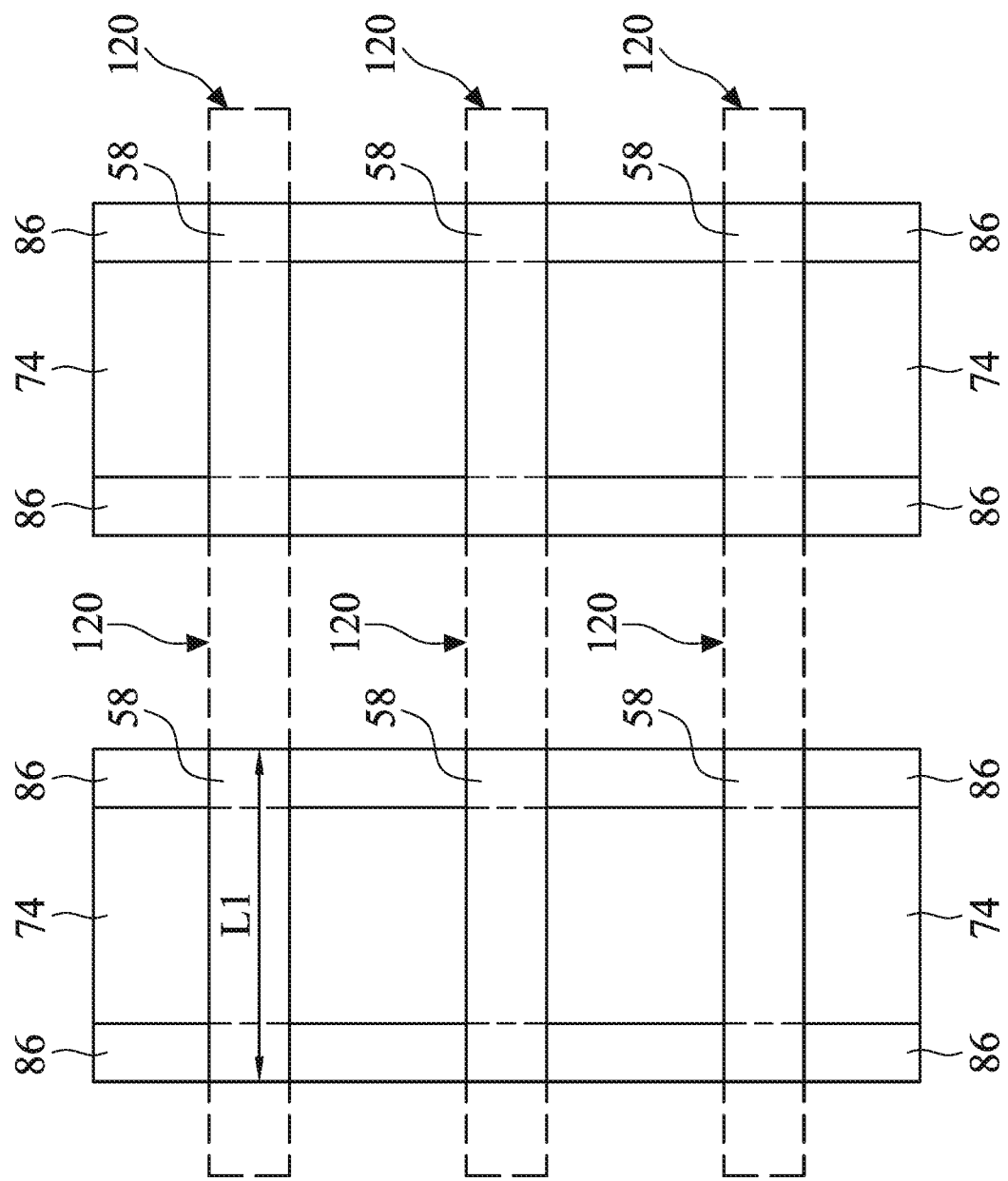

Referring first to FIGS. 10A-C, a first patterning process is performed on the fins 52 to form recesses 120 in source/drain regions of fins 52. During the formation of recesses 120, the region 50N or the region 50P may be masked by a mask (not shown), or the recesses 120 may be formed in the region 50N and the region 50P at the same time. The first patterning process may be performed in a manner such that the recesses 120 are formed between neighboring dummy gate structures (in interior regions of the fins 52), or between an isolation region 56 and adjacent dummy gate structures (in end regions of the fins 52). In some embodiments, the first patterning process may include a suitable anisotropic dry etching process using the dummy gate structures, gate spacers 86, and/or isolation regions 56 as a combined mask. In some embodiments, the recesses 120 may be formed having a vertical depth between about 40 nm and about 80 nm from top surfaces of the fins 52.

In some embodiments, after the first patterning process, upper sidewalls of the recesses 120 (e.g., sidewalls at or near the channel regions 58 of the fins 52) may be approximately aligned with the bottom edges of the gate spacers 86 in a plan view, as shown in FIGS. 10B-C. In other embodiments, after the first patterning process, the upper sidewalls of the recesses 120 may be offset from the bottom edges of the gate spacers 86. For example, the recesses 120 may extend beneath (e.g., "undercut") the gate spacers 86 or may extend beneath the dummy gate structures. In some embodiments, after the first patterning process, the upper sidewalls of the recesses 120 may have an approximately flat profile in a plan view, as shown in FIG. 10C. For example, the channel regions 58 extending between the recesses 120 may have approximately flat ends. In other embodiments, after the first patterning process, the upper sidewalls of the recesses 120 may have a different shape than shown in FIG. 10C. In some embodiments, after the first patterning process, the channel regions 58 between the recesses 120 may have a length L1 that is between about 10 nm and about 50 nm.

In some embodiments, the first patterning process includes a plasma etching process. The process gases used in the plasma etching process may include etchant gases such as $H_2$, HCl, HBr, $Cl_2$, $CH_4$, $C_2H_4$, $SF_6$, the like, other gases, or a combination of gases. In some embodiments, carrier gases, such as $N_2$, Ar, He, Xe, or the like, may be used to carry process gases (e.g., etchant gases or other gases) into the processing chamber. The process gases may be flowed into the processing chamber at a rate between about 10 sccm and about 3000 sccm. For example, the etchant gases may be flowed into the processing chamber or plasma generation chamber at a rate between about 10 sccm and about 1000 sccm, such as about 100 sccm. Carrier gases may be flowed into the processing chamber at a rate between about 100 sccm and about 35000 sccm, such as about 5000 sccm. In some embodiments, the plasma etching process is performed at a temperature between about 50° C. and about 400° C., such as about 330° C. A pressure in the processing chamber may be between about 1 mTorr and about 600 mTorr, such as about 100 mTorr. In some embodiments, the plasma etching process includes multiple steps.

Turning now to FIGS. 11A-D, a second patterning process is performed on the fins 52 to form reshaped recesses 122 from the recesses 120, in accordance with some embodiments. FIG. 11D illustrates a close-up plan view of a single fin 52 such as shown in FIG. 11C. The second patterning process includes an etching process (e.g., an anisotropic etching process) that etches surfaces of the recesses 120 to increase the size of the recesses 120 and change the shape of the recesses 120. Recesses 120 that have been reshaped in this manner by the second patterning process are referred to as reshaped recesses 122. In some embodiments, the second patterning process may etch between about 0.1 nm and about 5 nm into surfaces of the recesses 120 to form the reshaped recesses 122. The second patterning process may etch some surfaces of the recesses 120 more than other surfaces of the recesses 120. For example, the second patterning process may etch the sidewalls of the recesses 120 more than the bottom surfaces of the recesses 120. In some embodiments, the second patterning process may be controlled to etch the sidewalls of the recesses 120 more than the bottom surfaces, about the same as the bottom surfaces, or less than the bottom surfaces. In some embodiments, the reshaped recesses 122 may have a vertical depth between about 0.1 nm and about 10 nm from the top surface of the fins 52.

In some embodiments, the second patterning process etches surface regions of the recesses 120 that are adjacent the gate spacers 86 ("edge regions") more than surface regions of the recesses 120 that are away from the gate spacers 86 ("center regions"). In other words, the second patterning process etches regions of a fin 52 that are near sidewalls of the fin 52 more than the second patterning process etches regions of the fin 52 that are away from sidewalls of the fin 52. In this manner, after the second patterning process, edge regions of the reshaped recesses 122 may extend farther under the gate spacers 86 than center regions of the reshaped recesses 122. As such, after the second patterning process, upper sidewalls of the reshaped recesses 122 may have a round (e.g., "U-shaped") or tapered profile in a plan view, as shown in FIGS. 11C-D. For example, the channel regions 58 extending between the reshaped recesses 122 may have rounded or tapered ends. In some embodiments, edge regions of the reshaped recesses 122 extend under the dummy gate structures.

Referring to FIG. 11D, in some embodiments, center regions of the reshaped recesses 122 extend a distance D1 under the gate spacers 86 and edge regions of the reshaped recesses 122 extend a distance D2 under the gate spacers 86 that is greater than distance D1. In some embodiments, distance D1 may be between about 0 nm and about 10 nm. In some embodiments, distance D2 may be between about 0.1 nm and about 5 nm greater than distance D1. In some embodiments, after the second patterning process, the channel regions 58 between the reshaped recesses 122 may have a center length L2 that is between about 10 nm and about 45 nm and an edge length L3 that is less than L2 and that is between about 9.5 nm and about 40 nm.

In some cases, reducing the length of a channel region can reduce the resistance (e.g., "channel resistance") of the channel regions, which can improve device performance. For example, a lower channel resistance can increase the on-current of a FinFET device. By using the second patterning process to reduce the edge length L3 of the channel regions 58, the resistance of the channel regions 58 can thus be reduced. Additionally, by forming the channel regions 58 having rounded ends, the relatively longer center length L2 of the channel regions 58 allows for more control over short-channel effects. In this manner, by forming the channel regions 58 having rounded ends as described, the resistance of the channel regions 58 can be reduced without undesirably increasing short-channel effects.

In some embodiments, the second patterning process includes a plasma etching process. The process gases used in the plasma etching process may include etchant gases such as $H_2$, HCl, HBr, $Cl_2$, $CH_4$, $C_2H_4$, $SF_6$, the like, other gases, or a combination of gases. In some embodiments, carrier gases, such as $N_2$, Ar, He, Xe, or the like, may be used to carry process gases (e.g., etchant gases or other gases) into the processing chamber. The process gases may be flowed into the processing chamber at a rate between about 10 sccm and about 3000 sccm. For example, the etchant gases may be flowed into the processing chamber or plasma generation chamber at a rate between about 10 sccm and about 1000 sccm, such as about 100 sccm. Carrier gases may be flowed into the processing chamber at a rate between about 10 sccm and about 35000 sccm, such as about 500 sccm. In some embodiments, the plasma etching process is performed at a temperature between about 50° C. and about 400° C., such as about 330° C. A pressure in the processing chamber may be between about 1 mTorr and about 600 mTorr, such as about 100 mTorr. In some embodiments, the plasma etching process is performed for a time between about 5 seconds and about 300 seconds. In some embodiments, the plasma etching process includes multiple steps, which may include steps having different plasma etching process parameters or different mixtures of etchant gases.

The plasma etching process parameters and etchant gases for the second patterning process are selected such that edge regions of the recesses 120 are etched at a greater rate than the center regions of the recesses 120. For example, the edge regions may be etched at a rate that is between about 100% and about 300% of the rate that the center regions are etched. In some cases, defects and interfacial states at the interface between the semiconductor material of the fins 52 and the dielectric material of the gate spacers 86 can cause the semiconductor material near the interfaces to be etched at a greater rate than bulk semiconductor material. For example, a plasma etching process including such as that described herein can have an etch selectivity over edge regions over center regions. In this manner, the second patterning process can be controlled to control the etching selectivity of edge regions over center regions, and thus control the shape of the channel regions 58.

Turning now to FIGS. 12A, 12B, and 12C, epitaxial source/drain regions 82 are formed in the fins 52 such that each dummy gate structure is disposed between respective neighboring pairs of the epitaxial source/drain regions 82. In some embodiments, the epitaxial source/drain regions 82 may extend into, and may also penetrate through, the fins 52. In some embodiments, the gate spacers 86 are used to separate the epitaxial source/drain regions 82 from the dummy gate structures by an appropriate lateral distance so that the epitaxial source/drain regions 82 do not short out subsequently formed gates of the resulting FinFETs. As shown in FIG. 12C, due to the shape of the reshaped recesses 122, portions of the epitaxial source/drain regions 82 adjacent edge regions of the fins 52 extend farther under the gate spacers 86 than portions of the epitaxial source/drain regions 82 adjacent center regions of the fins 52.

Then, the epitaxial source/drain regions 82 in the region 50N are epitaxially grown in the reshaped recesses 120. The epitaxial source/drain regions 82 may include any acceptable material appropriate for n-type FinFETs. For example, if the fins 52 are silicon, the epitaxial source/drain regions 82 in the region 50N may include materials exerting a tensile strain in the channel regions 58 of the fins 52, such as silicon, silicon carbide, phosphorous-doped silicon carbide, silicon phosphide, the like, or a combination thereof. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and epitaxially growing the epitaxial source/drain regions 82 in the reshaped recesses 122 of the region 50P. The epitaxial source/drain regions 82 may include any acceptable material appropriate for p-type FinFETs. For example, if the fins 52 are silicon, the epitaxial source/drain regions 82 in the region 50P may comprise materials exerting a compressive strain in the channel regions 58, such as silicon-germanium, boron doped silicon-germanium, germanium, germanium tin, the like, or a combination thereof. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The epitaxial source/drain regions 82 may have an impurity concentration of between about $10^{19}$ cm$^{-3}$ and about $10^{21}$ cm$^{-3}$. The n-type and/or p-type impurities for the epitaxial source/drain regions 82 may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of fins 52. In some embodiments, these facets cause adjacent the epitaxial source/drain regions 82 of a same FinFET to merge as illustrated by FIGS. 12C and 12D. In other embodiments, adjacent epitaxial source/drain regions 82 remain separated after the epitaxy process is completed, as illustrated by FIG. 12E. In the embodiments illustrated in FIGS. 12D and 12E, the gate spacers 86 are formed covering a portion of the sidewalls of the fins 52 that extend above the STI regions 56, thereby blocking the epitaxial growth. In some other embodiments, the spacer etch used to form the gate spacers 86 may be adjusted to remove the spacer material to allow the epitaxially grown region to extend to the surface of the STI region 56.

Figure 13B:
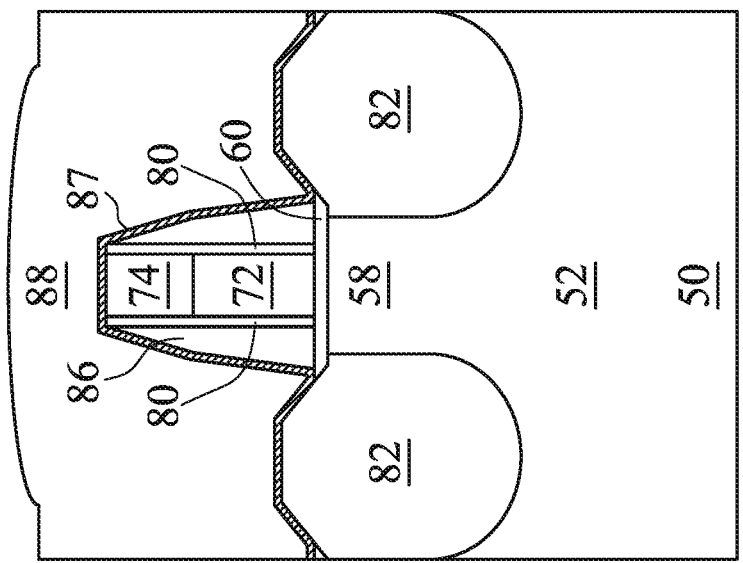
Figure 13A:
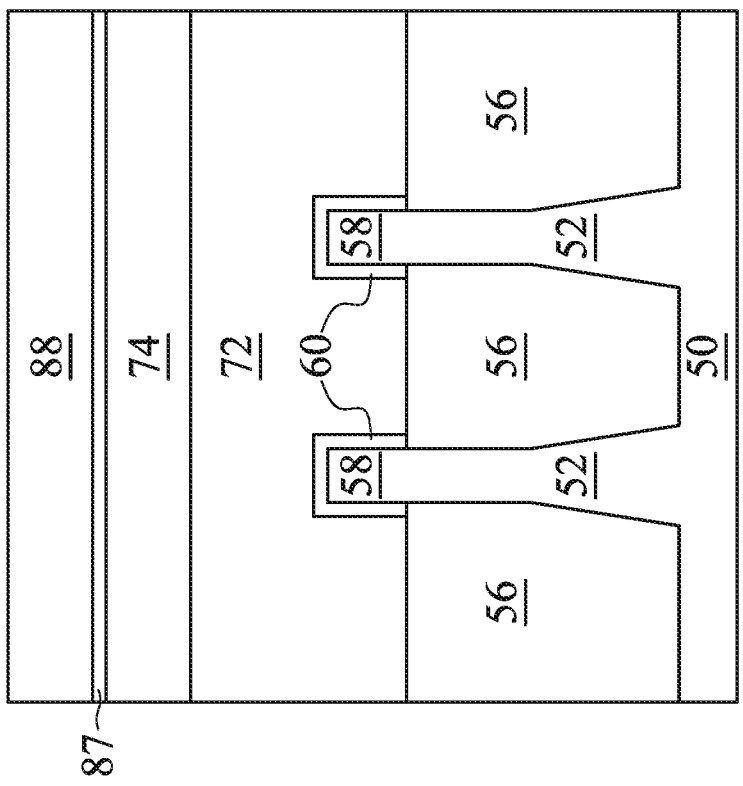

In FIGS. 13A and 13B, a first interlayer dielectric (ILD) 88 is deposited over the structure illustrated in FIGS. 12A-E. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 14B:
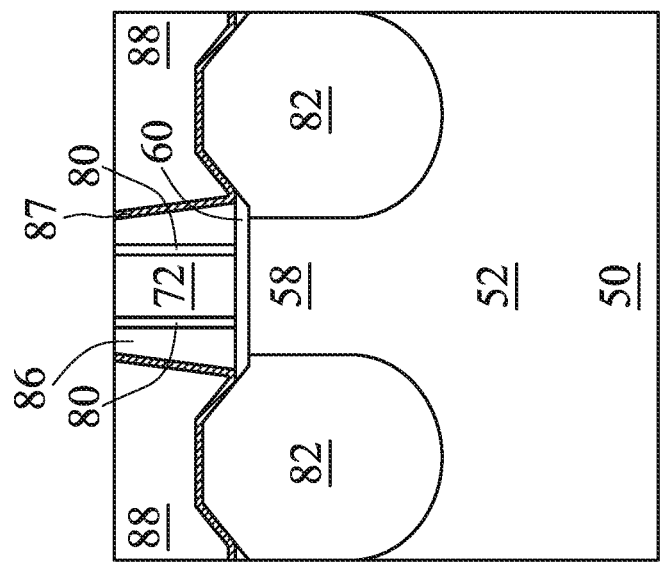
Figure 14A:
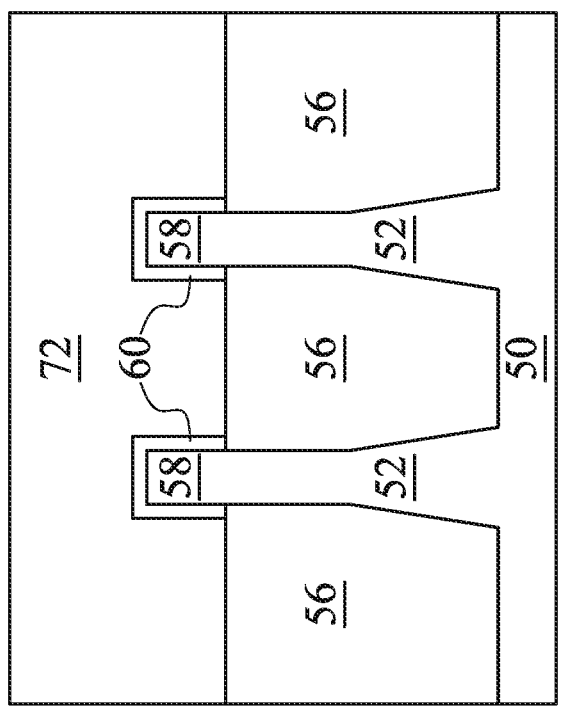

In FIGS. 14A and 14B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 15B:
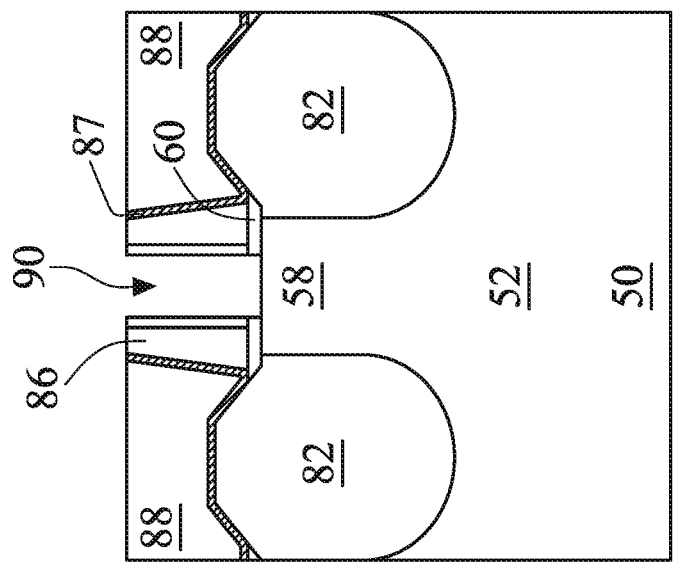
Figure 15A:
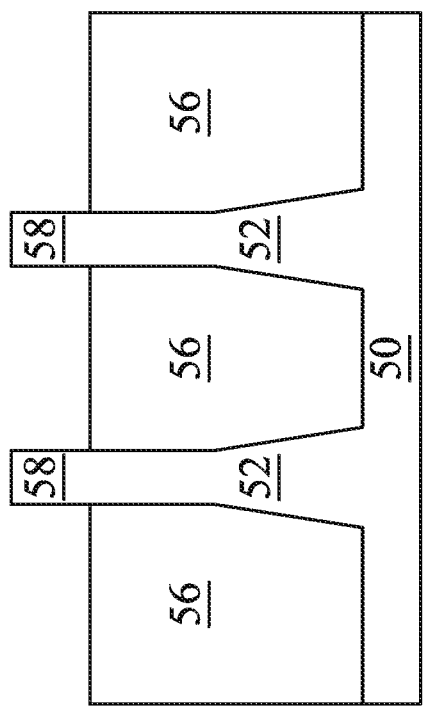

In FIGS. 15A and 15B, the dummy gates 72, and masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 16A:
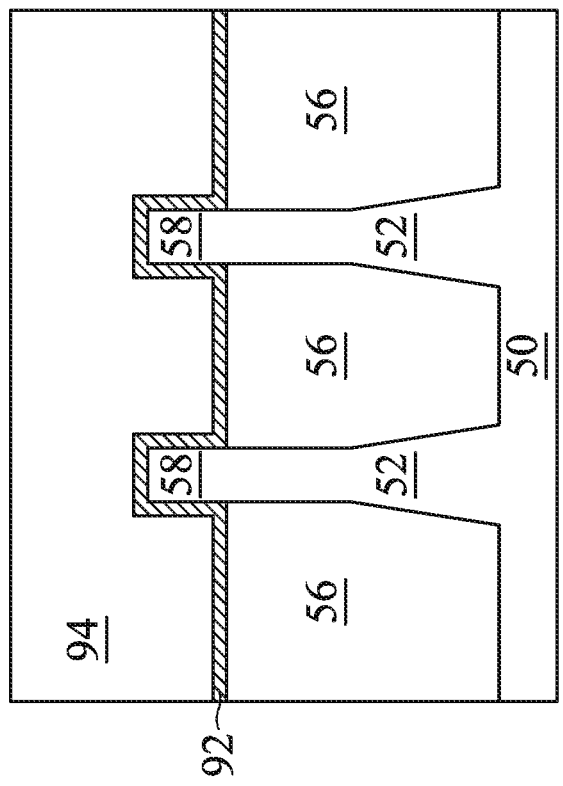
Figure 16B:
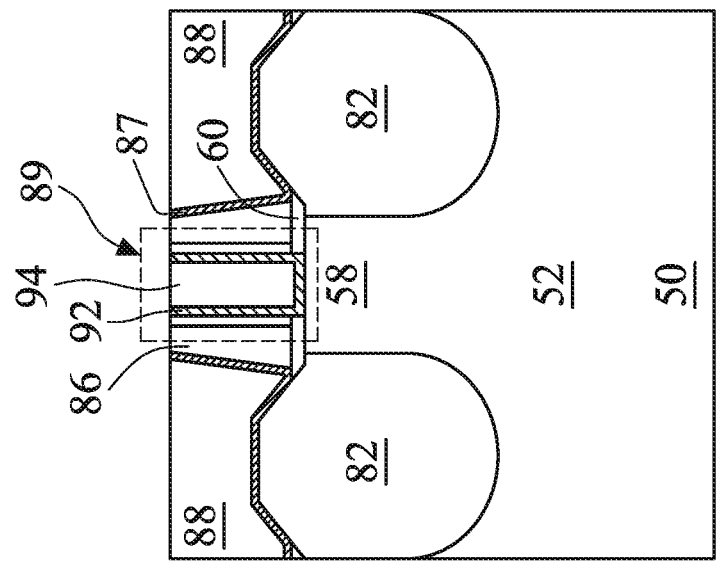
Figure 16C:
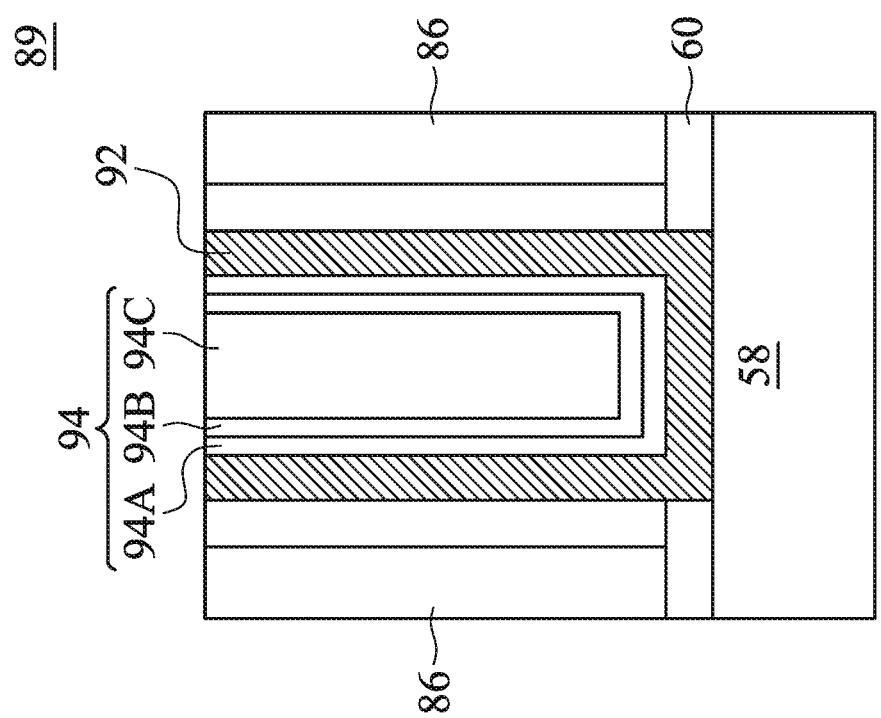

In FIGS. 16A and 16B, gate dielectric layers 92 and gate electrodes 94 are formed for replacement gates. FIG. 16C illustrates a detailed view of region 89 of FIG. 16B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., SiO$_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 16B, the gate electrode 94 may comprise any number of liner layers 94A, any number of work function tuning layers 94B, and a fill material 94C as illustrated by FIG. 16C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 17B:
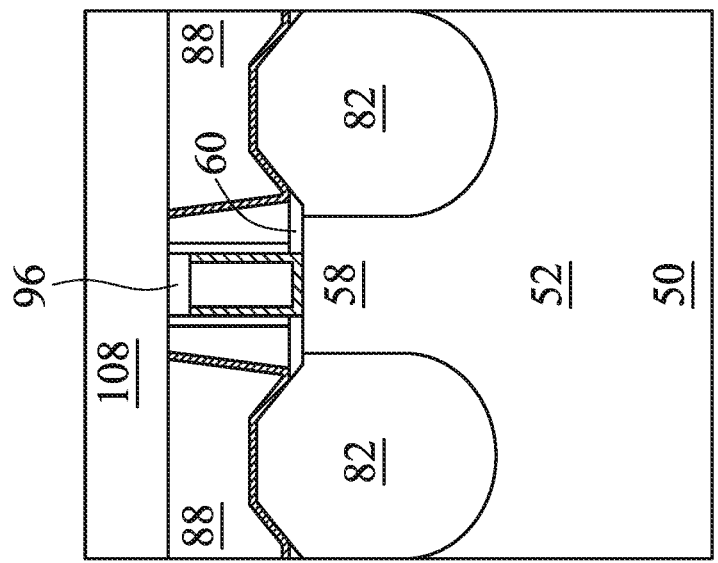
Figure 17A:
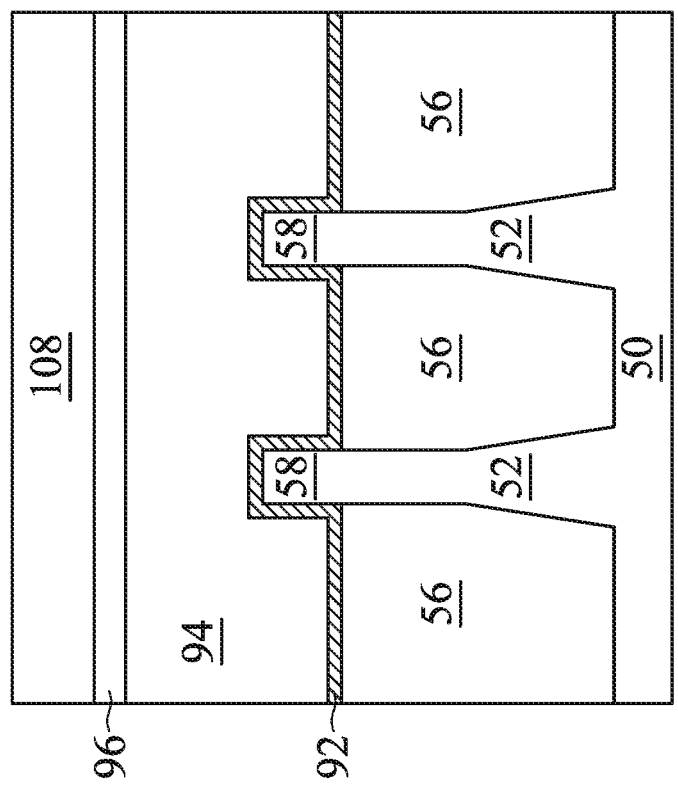

In FIGS. 17A and 17B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 17A and 17B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (FIGS. 18A and 18B) penetrate through the gate mask 96 to contact the top surface of the recessed gate electrode 94.

Figure 18B:
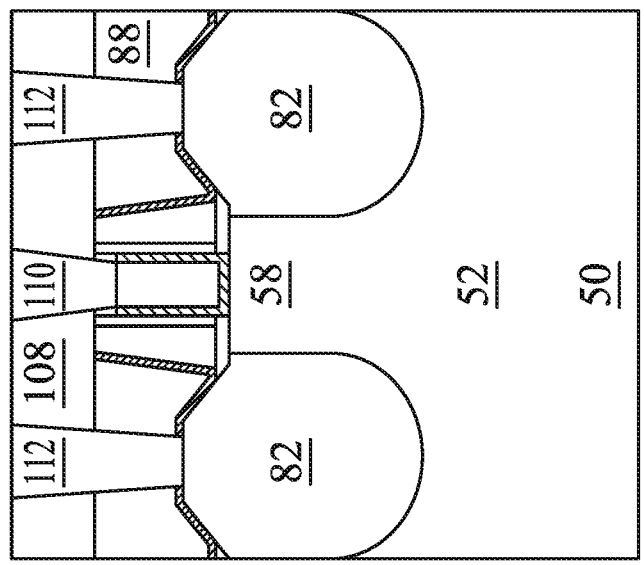
Figure 18A:
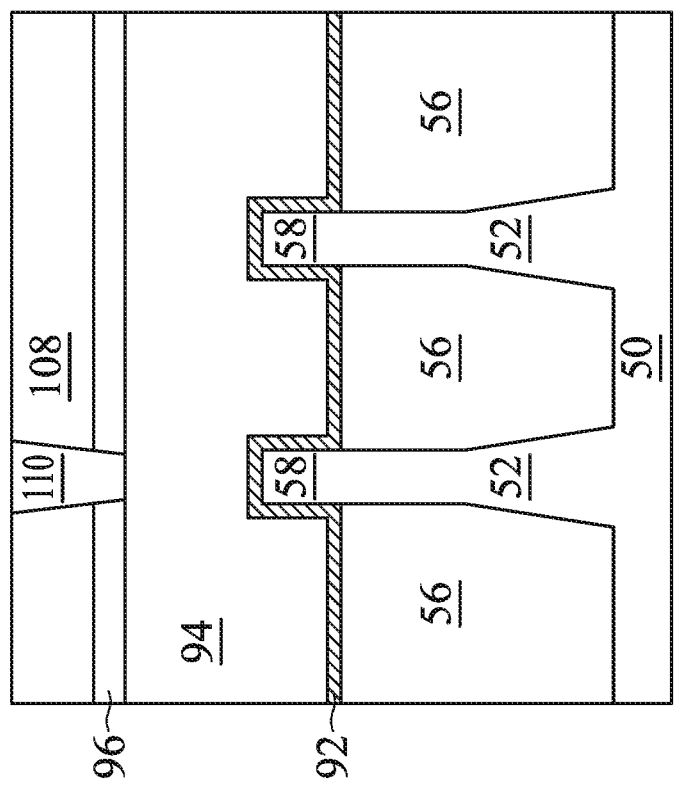

In FIGS. 18A and 18B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Various embodiments discussed herein allow for improved FinFET performance. By forming the channel regions of the fins such that the ends of the channel regions have rounded or tapered profiles, the overall channel length of the fins can be reduced, which can reduce the channel resistance of the fins. The overall channel length is reduced due to the sidewalls (e.g. edge regions) of the fins being etched at the fin ends more than the center regions of the fins are etched at the fin ends. However, because the center regions of the fin ends protrude toward the epitaxial source/drain regions, some short-channel effects may not be as severe as if the fins had flatter ends. Thus, the channel resistance of a FinFET device may be improved with less sensitivity to short-channel effects.

In accordance with an embodiment, a method includes forming a fin over a substrate, the fin including a first sidewall and a second sidewall opposite the first sidewall, forming an isolation region adjacent the fin, forming a dummy structure over the fin, forming a gate spacer on a sidewall of the dummy structure, recessing the fin adjacent the dummy structure to form a first recess using a first etching process, reshaping the first recess to form a reshaped recess using a second etching process, wherein first regions of the reshaped recess that are adjacent the first sidewall and second regions of the reshaped recess that are adjacent the second sidewall of the fin extend under the gate spacer a first distance, wherein third regions of the reshaped recess that are between the first regions of the reshaped recess and the second regions of the reshaped recess extend under the gate spacer a second distance, wherein the first distance is greater than the second distance, and epitaxially growing a source/drain region in the reshaped recess. In an embodiment, the first distance is between 0.1 nm and 5 nm greater than the second distance. In an embodiment, the second etching process includes a plasma etching process using $H_2$, HCl, HBr, $Cl_2$, $CH_4$, $C_2H_4$, or $SF_6$ as an etchant gas. In an embodiment, after the second etching process, a channel region of the fin has a sidewall with a convex profile. In an embodiment, the first recess extends under the gate spacer. In an embodiment, portions of the source/drain region grown in the third region of the reshaped recess are farther from the dummy structure than portions of the source/drain region grown in the first region of the reshaped recess. In an embodiment, the second etching process etches portions of the fin adjacent the first sidewall of the fin at a greater rate than the second etching process etchings portions of the fin that are between the first sidewall of the fin and the second sidewall of the fin. In an embodiment, after the second etching process, the first regions of the reshaped recess extend under the dummy structure.

In accordance with an embodiment, a method includes patterning a substrate to form a strip, the strip including a first semiconductor material, forming an isolation region along a sidewall of the strip, an upper portion of the strip extending above a top surface of the isolation region, forming a dummy structure along sidewalls and a top surface of the upper portion of the strip, performing a first etching process on an portion of the strip to form a recess, the recess exposing a sidewall of a channel region of the strip, performing a second etching process on the sidewall of the channel region, wherein after the second etching process the sidewall of the channel region has a rounded profile, and epitaxially growing a source/drain region in the recess. In an embodiment, the second etching process etches exposed portions of the channel region that are adjacent the dummy structure at a greater rate than exposed portions of the channel region that are away from the dummy structure. In an embodiment, after the first etching process, the sidewall of the channel region is flat. In an embodiment, the first etching process includes a first plasma etching process and the second etching process includes a second plasma etching process that is different from the first plasma etching process. In an embodiment, the second plasma etching process includes etching using $H_2$, HCl, HBr, $Cl_2$, $CH_4$, $C_2H_4$, or $SF_6$. In an embodiment, after the second etching process, the recess has a concave sidewall. In an embodiment, after the second etching process, the recess extends under the dummy structure.

In accordance with an embodiment, a device includes a fin over a substrate, the fin including a first end and a second end, wherein the first end of the fin has a convex profile, an isolation region adjacent the fin, a gate structure along sidewalls of the fin and over the top surface of the fin, a gate spacer laterally adjacent the gate structure, and an epitaxial region adjacent the first end of the fin. In an embodiment, the second end of the fin includes a convex profile. In an embodiment, a first distance between the first end and the second end measured at a sidewall of the fin is between 0.1 nm and 6 nm smaller than a second distance between the first end and the second end measured at the center of the fin. In an embodiment, portions of the epitaxial region adjacent the center of the first end of the fin are farther from the gate structure than portions of the epitaxial region adjacent the edges of the first end of the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin over a substrate, the fin comprising a first sidewall and a second sidewall opposite the first sidewall;
   forming an isolation region adjacent the fin;
   forming a dummy structure over the fin;
   forming a gate spacer on a sidewall of the dummy structure;
   recessing the fin adjacent the dummy structure to form a first recess using a first etching process;
   reshaping the first recess to form a reshaped recess using a second etching process, wherein first regions of the reshaped recess that are adjacent the first sidewall and second regions of the reshaped recess that are adjacent the second sidewall of the fin extend under the gate spacer a first distance, wherein third regions of the reshaped recess that are between the first regions of the reshaped recess and the second regions of the reshaped recess extend under the gate spacer a second distance, wherein the first distance is greater than the second distance; and
   epitaxially growing a source/drain region in the reshaped recess.

2. The method of claim 1, wherein sidewalls of the first recess have a flat profile.

3. The method of claim 1, wherein the first distance is between 0.1 nm and 5 nm greater than the second distance.

4. The method of claim 1, wherein the second etching process comprises a plasma etching process using $H_2$, HCl, HBr, $Cl_2$, $CH_4$, $C_2H_4$, or $SF_6$ as an etchant gas.

5. The method of claim 1, wherein, after the second etching process, a channel region of the fin has a sidewall with a convex profile.

6. The method of claim 1, wherein the first recess extends under the gate spacer.

7. The method of claim 1, wherein portions of the source/drain region grown in the third region of the reshaped recess are farther from the dummy structure than portions of the source/drain region grown in the first region of the reshaped recess.

8. The method of claim 1, wherein the second etching process etches portions of the fin adjacent the first sidewall of the fin at a greater rate than the second etching process etchings portions of the fin that are between the first sidewall of the fin and the second sidewall of the fin.

9. The method of claim 1, wherein, after the second etching process, the first regions of the reshaped recess extend under the dummy structure.

10. A method comprising:
    patterning a substrate to form a strip, the strip comprising a first semiconductor material;
    forming an isolation region along a sidewall of the strip, an upper portion of the strip extending above a top surface of the isolation region;
    forming a dummy structure along sidewalls and a top surface of the upper portion of the strip;
    performing a first etching process on an portion of the strip to form a recess, the recess exposing a sidewall of a channel region of the strip;
    performing a second etching process on the sidewall of the channel region, wherein after the second etching process the sidewall of the channel region has a rounded profile; and
    epitaxially growing a source/drain region in the recess.

11. The method of claim 10, wherein the second etching process etches exposed portions of the channel region that are adjacent the dummy structure at a greater rate than exposed portions of the channel region that are away from the dummy structure.

12. The method of claim 10, wherein after the first etching process, the sidewall of the channel region is flat.

13. The method of claim 10, wherein the first etching process comprises a first plasma etching process and wherein the second etching process comprises a second plasma etching process that is different from the first plasma etching process.

14. The method of claim 10, wherein, after the second etching process, the recess has a concave sidewall.

15. The method of claim 10, wherein, after the second etching process, the recess extends under the dummy structure.

16. The method of claim 13, wherein the second plasma etching process comprises etching using $H_2$, HCl, HBr, $Cl_2$, $CH_4$, $C_2H_4$, or $SF_6$.

17. A device comprising:
    a fin over a substrate, the fin comprising a first end and a second end, wherein the first end of the fin has a convex profile in a plan view;
    an isolation region adjacent the fin;
    a gate structure along sidewalls of the fin and over the top surface of the fin;
    a gate spacer laterally adjacent the gate structure; and
    an epitaxial region adjacent the first end of the fin, wherein the first end of the fin protrudes into the epitaxial region.

18. The device of claim 17, wherein the second end of the fin has a convex profile in a plan view.

19. The device of claim 17, wherein a first distance between the first end and the second end measured at a sidewall of the fin is between 0.1 nm and 6 nm smaller than a second distance between the first end and the second end measured at the center of the fin.

20. The device of claim 17, wherein portions of the epitaxial region adjacent the center of the first end of the fin are farther from the gate structure than portions of the epitaxial region adjacent the edges of the first end of the fin.

* * * * *